United States Patent [19]

Eddy

[11] Patent Number: 5,306,699
[45] Date of Patent: * Apr. 26, 1994

[54] REACTOR VESSEL FOR MANUFACTURE OF SUPERCONDUCTING FILMS

[75] Inventor: Michael M. Eddy, Goleta, Calif.

[73] Assignee: Superconductor Technologies, Inc., Santa Barbara, Calif.

[*] Notice: The portion of the term of this patent subsequent to Aug. 18, 2009 has been disclaimed.

[21] Appl. No.: 781,358

[22] Filed: Oct. 25, 1991

Related U.S. Application Data

[63] Continuation-in-part of Ser. No. 516,078, Apr. 27, 1990, Pat. No. 5,139,998, which is a continuation-in-part of Ser. No. 308,149, Feb. 8, 1989, abandoned, which is a continuation-in-part of Ser. No. 238,919, Aug. 31, 1988, Pat. No. 5,071,830.

[51] Int. Cl.[5] .............................................. C01F 11/02
[52] U.S. Cl. .................................... 422/245; 505/729; 505/783; 505/950; 422/248; 156/603; 118/715
[58] Field of Search .................. 505/1, 729, 783; 422/245, 247; 156/603, DIG. 73; 118/715

[56] References Cited

U.S. PATENT DOCUMENTS

| 3,925,147 | 12/1975 | Kimura | 156/603 |
|---|---|---|---|
| 4,636,280 | 1/1987 | Nakai et al. | 156/603 |
| 4,737,232 | 4/1988 | Fliestein et al. | 156/610 |
| 4,762,576 | 8/1988 | Wilson et al. | 156/611 |
| 4,820,651 | 4/1989 | Prince et al. | 156/DIG. 73 |
| 4,828,648 | 5/1989 | La Chapelle et al. | 156/605 |
| 4,870,052 | 9/1989 | Engler et al. | 505/1 |
| 4,929,142 | 5/1990 | Nespor | 414/563 |
| 4,929,594 | 5/1990 | Gopalakrishnen et al. | 505/1 |
| 4,962,083 | 10/1990 | Hermann et al. | 505/1 |
| 5,139,998 | 8/1992 | Eddy et al. | 118/715 |

FOREIGN PATENT DOCUMENTS

| 357509 | 3/1990 | European Pat. Off. | 505/1 |
|---|---|---|---|
| 02-38302 | 2/1990 | Japan | 505/1 |

Primary Examiner—Robert Kunemund
Attorney, Agent, or Firm—Lyon & Lyon

[57] ABSTRACT

Methods and reactors are described for the production of high temperature superconductor films on a variety of substrates, particularly those films which include volatile components during their manufacture. The reactors are particularly useful for producing films containing thallium. The reactors provide for relatively low volume cavities in which the substrate is disposed, and control of the thallium oxide overpressure during the processing. In a preferred embodiment, one or more holes or apertures are made in the reactor to permit thallium and thallium oxide to controllably leak from the reactor. For manufacture of double sided superconducting films, a reactor is used having top and bottom plates each with one or more holes in them. Uniform high temperature superconducting films are obtained while inhibiting reaction between the substrate and superconducting film during the processing.

19 Claims, 3 Drawing Sheets

REACTOR VESSEL FOR MANUFACTURE OF SUPERCONDUCTING FILMS

CROSS-REFERENCE TO RELATED APPLICATIONS

This application is a continuation-in-part of application Ser. No. 07/516,078, filed Apr. 27, 1990, now U.S. Pat. which is a continuation-in-part of Ser. No. 308,149, filed Feb. 8, 1989, now abandoned, which is a continuation-in-part of application Ser. No. 238,919, filed Aug. 31, 1988, now U.S. Pat. 5,071,830.

INTRODUCTION

1. Technical Field

The field of this invention is the production of high temperature superconductor films which contain volatile components, such as thallium. More particularly, it relates to useful methods and devices for manufacturing superconductor films, particularly large area and double sided films.

1. Background

After the initial excitement of being able to produce high temperature superconductors, namely materials which are superconducting above the vaporization temperature of nitrogen, the problems of producing these materials in useful form have become only too evident. Among the cuprate compositions which are particularly interesting because of their high superconducting transition temperature are the thallium compounds. These compounds are particularly difficult to prepare because of the nature of thallium oxides. $Tl_2O_3$ is unstable, so that at the elevated processing temperatures normally employed, it decomposes to $Tl_2O$ and $O_2$. In order to maintain the thallium present in the oxide mixture used to form the superconductor, it is necessary to control the amount of thallium in the vapor phase and in the liquid phase of the oxide compositions. Among the other difficulties with processing thallium is that thallium is highly reactive, so that reactors which are employed must take into account the reaction of the structural materials with thallium. One is therefore confronted with working with a highly reactive material which can exist in both the vapor and liquid phases simultaneously at elevated temperatures, while trying to control the distribution of the thallium between the liquid and vapor phases in order to obtain the appropriate compositions for a high temperature superconductor.

For many applications, one wishes to have a thin high temperature superconducting film on a substrate. Among the substrates are magnesium oxide, lanthanum aluminate, yttria stabilized zirconia and sapphire. For microwave device development, sapphire has many advantages including extremely low loss tangent at low temperature, availability in large area substrates, low cost and general acceptance as a microwave substrate. In addition, for low loss films on sapphire, several orders of magnitude improvement in the Q of a microwave device can still be achieved as high temperature superconducting films are improved. However, formation of thallium high temperature superconducting films on sapphire are subject to reaction and formation of barium aluminate compounds as second phases.

There is substantial interest in being able to produce thallium cuprate high temperature superconducting films on a wide variety of substrates for production of microwave and millimeter wave applications. It is therefore of interest to provide processes and reactors which will allow for the controlled and reproducible production of high temperature superconducting films on substrates of interest for the production of devices.

The earliest attempts to manufacture thallium containing high temperature superconductors focused on bulk formation as opposed to thin film formation. Recognizing volatility of thallium, some workers opted to enclose the amorphous precursor deposit and substrate within a sealed vessel to reduce thallium loss. For example, Engler et al, U.S. Pat. No. 4,870,052 recites the formation of a bulk thallium containing superconductor by the mixing together of oxides and heating in a preheated oven in a closed vessel in the presence of oxygen for from 1 to 5 hours at a temperature from 850° to 900° C. Engler most prefers the closed vessel be a sealed quartz vessel. The sample of admixed metal oxides may be held in a crucible, made for example from gold, silver, platinum, aluminum oxide or zirconium oxide and sealed inside the quartz vessel. Engler notes that even when the reaction is carried out in a sealed vessel, approximately 20% of the thallium is lost due to the volatilization and reaction with the quartz. Similarly, Gopalakrishnan, U.S. Pat. No. 4,929,594 suggests heat treatment of the mixed reactants in a tube made of non-reacting metal such as gold where the tube is welded shut. Alternatively, other workers have followed a post-composition heat treatment process in which there is no containment of volatile species. For example, Hermann et al, U.S. Pat. No. 4,962,083 discloses a preparation technique in which the mixed oxides are pressed into a pellet which is placed in a preheated tube furnace, having oxygen flowing therethrough. Studies have been reported in which the high-temperature heat treatment has been conducted under a variety of conditions, including use of an opened crucible versus a covered or sealed crucible. See e.g., Lee et al, "Superconducting Tl-Ca-Ba-Cu-O Thin Films With Zero Resistance at Temperatures of Up to 120 K", Appl.Phys.Lett., 53 (4), Jul. 25, 1988, p. 329-331.

The earliest high temperature superconducting films formed were relatively small, having diameters often well less than 1 centimeter. It is highly desirable to make larger area films for many applications. Current commercially available substrates are larger than 1 centimeter, some such as lanthanum aluminate being available in up to 2 inch diameters. It is desirable to be able to use the largest available substrates to form high temperature superconducting films.

It is further desirable to manufacture double-sided films, that is, a substrate having superconductive material on multiple surfaces. Formation of such films has been extremely difficult, since processing techniques used to perfect the superconducting properties for one side of the film have damaged the superconducting properties of the other side of the film. Previously, it has been virtually impossible to repeatably form commercial grade double-sided high temperature superconducting films.

SUMMARY OF THE INVENTION

Methods and reactors are provided for the production of high temperature superconducting films which contain volatile materials such as thallium by providing for controlled leakage of the volatile material or its compounds from the manufacturing vessel. The vessel includes an intentional leak, which may be repeatably formed. Desired morphology and superconducting phase is engineered by control of the temperature profile, oxygen pressure, diffusion rate out of the reactor and starting composition of the precursor film. Use of a relatively small volume vessel permits rapid equilibrium to be achieved between the film and vapor.

In one preferred embodiment, the reactor comprises a bottom plate, spacer and a top plate, having one or more apertures to permit leakage of the volatile components out of the reactor vessel. For the manufacture of larger area films, the top plate is preferably provided with a plurality of holes to permit escape of the volatile components. For smaller films, a single aperture may be sufficient.

Substrates having high temperature superconductors on both sides may be manufactured in a vessel wherein the top and bottom plates contain one or more apertures each. Preferably, thermal contact between the substrate and the vessel is minimized, such as through the use of point contact pins. In the preferred method of manufacture, the coated substrate is heated to the desired temperature, with the heating rate approaching the maximum temperature being relatively low.

By employing the subject heating profile and reactors, high temperature superconducting films on a variety of substrates may be reproducibly obtained. Most specifically, any size of substrate, whether of large or small area, may be used. Further, double-sided films may be formed.

Accordingly, it is a principal object of this invention to provide apparatus and techniques for the production of superconducting films of any size.

It is a further principal object of this invention to permit the manufacture of double-sided superconducting films.

DESCRIPTION OF SPECIFIC EMBODIMENTS

Figure 1:
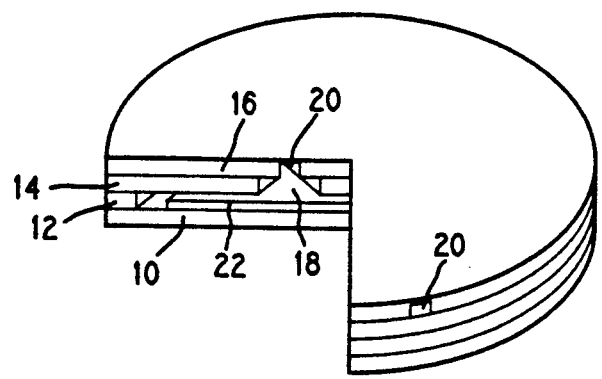
FIG. 1 is a perspective view including cut-out of a reaction vessel and substrate.

Methods and apparatus are provided for the reproducible production of high temperature superconducting films which include a relatively volatile component at some stage during the film's manufacture. The most important examples are thallium based cuprate films on a wide variety of substrates. However, the apparatus and techniques disclosed here are generally useful for forming superconducting films, particularly those with volatile components. For ease of explanation, the description which follows will focus on the formation of thallium based superconductors.

The methods employ apparatuses which allow for controlled increase in temperature to a predetermined elevated temperature, maintenance at the predetermined temperature and relatively rapid cooling substantially below the predetermined temperature. In addition, the apparatuses are designed to maintain controlled thallium oxide and oxygen pressures over the film forming composition, whereby formation of the superconducting composition occurs with precipitation of the superconducting film from a melt. The resulting products comprising the high temperature superconductor thallium cuprate based films on a variety of substrates find use in microwave and millimeter wave devices, where high superconducting transition temperatures, low surface resistance on low loss tangent substrates, such as MgO, $LaAlO_3$, $LaGaO_3$, or sapphire, and short penetration depths are necessary or desirable.

The films provided for in this invention are comprised of thallium, calcium, barium and copper oxides. The stoichiometry may include 2021, 2122, 2223, or such other stoichiometries as may provide for superconductivity. The films may be oriented films, so as to have a substantially uniform crystallinity. The films may be comprised of a single crystal or a plurality of crystals joined at their grain boundaries. The films may be highly oriented with the c-axis substantially normal to the surface of the substrate as demonstrated by X-ray analysis or electron beam channeling techniques. For the most part, single phase films will be obtained, although as desired, mixtures of two of the phases or related phases may be achieved within the film. For some applications, polycrystalline films may be prepared. Depending on the substrate, epitaxial films may be obtained.

The thickness of the film may be controlled. The film may be as thin as one layer, where the layer includes all of the necessary planes to obtain superconductivity, generally from about 30–50 Å or may be as thick as two micrometers or greater, depending upon the particular application. Thin films may be conveniently prepared by initially preparing a thicker film and then reducing the thickness, e.g., by ion milling. The thickness of the film is primarily a practical consideration, rather than a significant limitation of the procedures employed depending upon the characteristics for current density and penetration depth.

For many uses, a fraction of a micrometer thickness will be employed, generally in the range of about 0.1–1 μm. The film will have a superconducting transition temperature of at least 75K, more usually 90K, preferably at least at 100K, more preferably about 115K, and particularly preferred at least about 122K, where the transition temperature has so far been substantially less than about 150K. 2122 composition films can be achieved with $T_c$ of at least 105K and can be 110K or higher and 2223 films with a $T_c$ of at least 110K or higher and 2223 films with a $T_c$ of at least 110K and can be 122K or higher. The superconducting transition temperature should be as high as feasible, though in some situations one parameter may be compromised for another parameter. For the most part the films will be used at temperatures in the range of about 60–110K.

The films will usually have critical current densities at 77K of at least about $10^3 A/cm^2$, usually at least about $10^6 A/cm^2$. For microwave and millimeter wave applications, the surface resistance or impedance will generally be less than about $10^{-3} \Omega$, more usually less than about $10^{-4} \Omega$, at 10 GHz and at a temperature above 50K, preferably above about 75K.

A wide variety of substrates may be employed, such as magnesium oxide, lanthanum aluminate, yttria stabilized zirconia, lanthanum gallate, lanthanum strontium aluminate, sapphire, buffered sapphire, metals, such as Ag, Au, Pt, or other reactive or inert substrates. The subject method finds particular application, with reactive substrates, where the processing allows for minimal reaction between the high temperature superconductor precursor layer and the substrate.

Generally, the overall method for formation of superconducting films in connection with the disclosed apparatus and method comprise a two step process:

(1) Formation of a superconducting precursor film on the substrate, and (2) Post-deposition thermal processing to form a superconducting film.

The precursor film may be formed by any known technique, such as by sol-gel, laser ablation, thermal evaporation, liquid phase epitaxy, electron beam or magnetron sputtering, or chemical vapor deposition. The sol-gel and laser ablation techniques are described in detail in U.S. patent applications Ser. No. 308,149, filed Feb. 8, 1989, entitled: LIQUID PHASE THALLIUM PROCESSING AND SUPERCONDUCTING PRODUCTS, and Ser. No. 238,919, filed Aug. 31, 1988, entitled: SUPERCONDUCTOR THIN LAYER COMPOSITIONS AND METHODS, both of which are incorporated herein by reference.

Once the film has been formed, a relatively strict temperature regimen will be employed for the heating of the film to provide the proper composition for the high temperature superconductor film. Generally, controlled, uniform heating will be employed to achieve a predetermined temperature in the range of about 800° to 900° C., more usually about 800° to 860° C. For the 2122 phase, heating to temperatures less than 850° C. have proved sufficient, with temperatures less than 835° C. being more preferred, and a maximum temperature of 820° C. being optimal for optimization of certain device characteristics. The heating rate should be carefully controlled and uniform over the entire substrate. The heating rate controls two key film processing characteristics: a) degree of melting, and b) $Tl_2O$ evaporation rate from the film. The more rapid the heating rate employed, the more completely melting is observed. In extreme cases for very Tl rich deposit compositions, rapid heating rates will result in films with a splotchy appearance and poor substrate coverage. The rate of heating will usually be at least about 5° C./min., and may be as high as 200° C./min. or higher, usually in the range of 5° to 40° C./min. The time for which the temperature is maintained will generally range from about 0.5–300 min. The temperature will then be dropped at a rate in about the same range as the rate of heating.

There are a number of parameters which can be varied in relation to the thallium and oxygen present in the film and the cavity. One can provide for excess thallium in the superconducting film precursor, as a film on the wall of the cavity, or by introduction of thallium oxide from an outside source. Alternatively, one may remove thallium oxide from the cavity by providing for a chemical thallium oxide sink on the walls of the cavity or by providing for a conduit into the cavity which allows for removal of thallium oxide from the cavity. In addition, one may vary the oxygen over pressure in the cavity, which will affect the volatility of thallium oxide in the film or source. Thus, by varying the thallium oxide in the cavity which will be directly related to the amount of thallium oxide in the precursor film, one can control the formation and composition of the high temperature superconducting film.

The devices of the subject invention will have means for controlling the temperature profile of the process, so that the desired rate of heating/cooling can be achieved with desired maintenance at the predetermined elevated temperature. In addition, means are provided for controlling the thallium and thallium oxide overpressure, which means may include controlling the oxygen overpressure, as well as providing for a source of sink of thallium oxide within the reactor cavity. In addition, the volume of the reactor cavity is controlled, so as to be preferably only a small multiple of the volume of the superconducting film precursor and access to the cavity can be provided with means for introducing or removing the volatile components present in the cavity.

A number of reactor designs are described in detail below. Generally, the reactor designs permit controlled leakage of volatile components, such as thallium and thallium oxide, from the reactor vessel, resulting in a crystal having the desired amount of thallium.

FIG. 1 shows a perspective view including cut-out of a reactor vessel useful for post-deposition processing of precursor deposits on a substrate. Generally, the reaction vessel comprises a base 10, spacer ring 12, top plate 14 and cover plate 16. A substrate and precursor film 22 are disposed within the reaction chamber. Generally, the reaction vessel of FIG. 1 provides a path for communication between the space adjacent the substrate 22 and external of the reaction vessel.

In the preferred embodiment, the components of the reaction vessel are made of polished sapphire. However, any material compatible with the temperature requirements and sufficiently nonreactive to thallium oxide may be used. In the embodiment shown, the components are circular, done so for ease of manufacture, but may be of any desired shape.

In the form shown, all of the components have an outside diameter of one inch. The base 10 has a thickness of 0.013 inches. The spacer ring 12 has a thickness of 0.125 inches and an inside diameter of 0.8 inches. The top plate is 0.013 inches thick and has a 0.15 inch diameter hole located at its center. The cover plate 16 is 0.040 inches thick and has a trench 20 of depth 0.020 inches and width 0.030 inches.

Figure 2A:
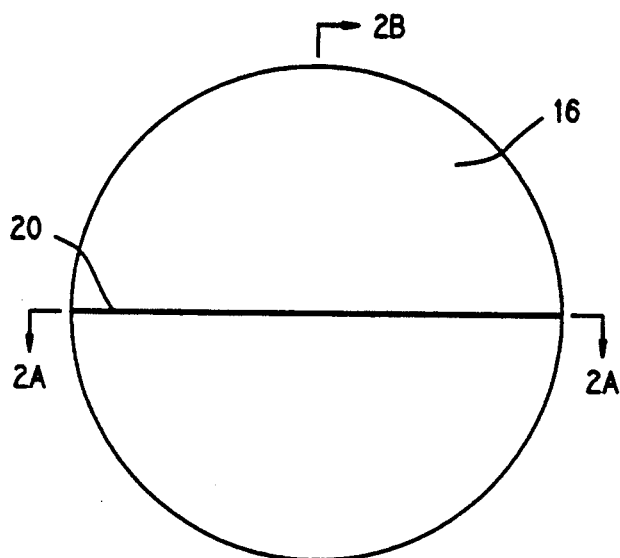
FIG. 2a and 2c are plan views of the top piece of the reaction vessel of FIG. 1, including two cross-sections.
Figure 2B:
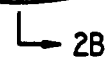
Figure 2C:

FIG. 2 shows a plan view of the cover plate 16. The cross-section at line A—A shows the trench 20. The cross-section at line B—B shows the trench in cross-section. The trench in the cover plate 16 is placed over the hole 18 in the top piece 14. The volatile vapors from the precursor film and substrate 22 may exit the reactor vessel via the hole 18 and channel 20 to a portion exterior to the reaction vessel.

Six principal methods may be used to control the rate of thallous oxide vaporization from the deposit which occurs during thermal processing. The first involves changing the amount of empty volume present in the cavity. This can be controlled by varying the thickness of the spacer or by placing inert spacers to take up excess volume in the reactor. A second method involves increasing the process temperature to increase thallium volatilization. A third method is to change the overall oxygen partial pressure during a particular time-temperature process sequence. Since oxygen actively suppresses volatilization of thallous oxide, lowering the total system pressure is an effective mechanism for increasing thallium volatilization at any given temperature. A fourth method is to vary the spacing between the individual substrate layers that make up the walls of the reactor. The greater the spacing between the substrates, the greater thallium evaporation rate from the film. For example, if the sapphire reactor wafers are fitted tightly together, either by use of inconel clips or heavy weights placed on the lever arm, loss of thallium from the film is extremely small, even when held at 860° C. in one atm of oxygen for reaction times of 8 min. or more. On the other hand, if the cap is omitted from the reactor, and the film heated in an open crucible, thallium completely evaporates in a few seconds. A fifth method for controlling thallium oxide vaporization is the rate of heating. The faster the rate of heating, the more liquid thallium oxide present and the greater the amount of vaporization. The sixth method involves the hold time and the elevated temperature. The greater the hold time, the more thallium oxide is vaporized and lost.

The use of extremely small reactor volumes guarantees rapid equilibrium between the film and vapor, thereby minimizing lateral composition or morphological gradients in the film. The thermal process geometry is both readily scalable and compatible with current available rapid thermal annealing furnace equipment. The thallous oxide vaporization rate from the film can be controlled by varying the oxygen partial pressure, temperature and the diffusion-limited (leak rate-gapped dimensions) loss rate from the reactor.

Figure 3:
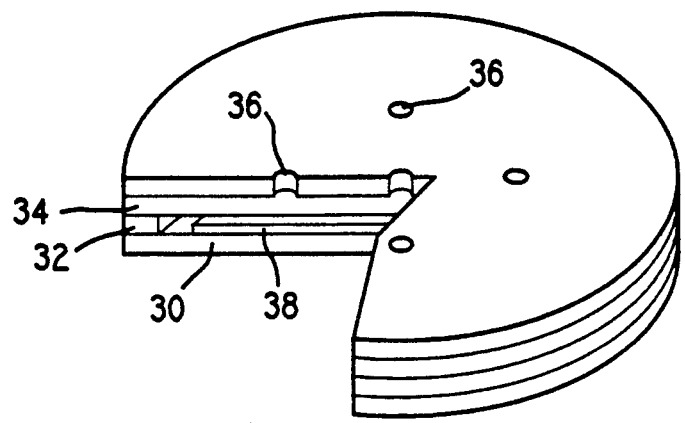
FIG. 3 is a perspective view including cut-away for a reaction vessel and substrate.

FIG. 3 shows a reactor design which is particularly well adapted for thermal processing of large area wafers. Structurally, a top plate 34 is provided with a plurality of holes 36 to permit escape of thallium and thallium oxide from the reactor vessel. A spacer ring 32 and bottom plate 30, in conjunction with top plate 34, define the relatively small volume in which the wafer having the deposited precursor film 38 is placed. For a 2 inch wafer, typical dimensions for the top piece 34 would be 3 inches in diameter, by 0.2 inches thick. The center spacer 32 would have a 3 inch outside diameter and preferably 2.0125 inch inside diameter, with a thickness of 0.125 inches. The base plate 30 would have a 3 inch diameter with a thickness of 0.125 inches. These dimensions may be appropriately modified to receive a wafer of any desired size.

In the preferred embodiment, the top piece 34, spacer 32 and bottom piece 30 are formed of sapphire crystals. Preferably, the crystals are double side polished to permit better sealing of the vessel when assembled. Such sapphire crystals are available from Union Carbide. In the embodiment shown, there are five holes 36 each having a diameter of 0.020 inches. One hole is located at the center of the top plate 34, and the remaining holes are each located on a radius from the center hole, ½ inch out.

Experimentally, the reactor of FIG. 3 has been used to produce superconducting films on 2 inch diameter lanthanum aluminate wafers. Typically, a reactor station is utilized which includes a Lindberg 3 zone 1200° C. furnace, an inconel pressure vessel, pressure control system and vacuum pump. Generally, for microstructure control, it has been found advantageous to heat the precursor film to a maximum temperature of less than 850° C.

Formation of the superconducting films by this post deposition processing technique utilizes the controlled loss of thallium to achieve the desired end stoichiometry. Numerous factors may be used to control the rate of thallium loss. For example, the particular geometry of the reaction vessel, including the size of the holes, bears upon the rate of thallium and thallium oxide loss. Further, the temperature profile may be varied to optimize the film results. Generally, for thin film devices, it is desirable to avoid temperature gradients, which in turn indicates a relatively slower heating rate than a faster heating rate. Further, the oxygen pressure may be varied to control the thallium volatility.

Figure 4:
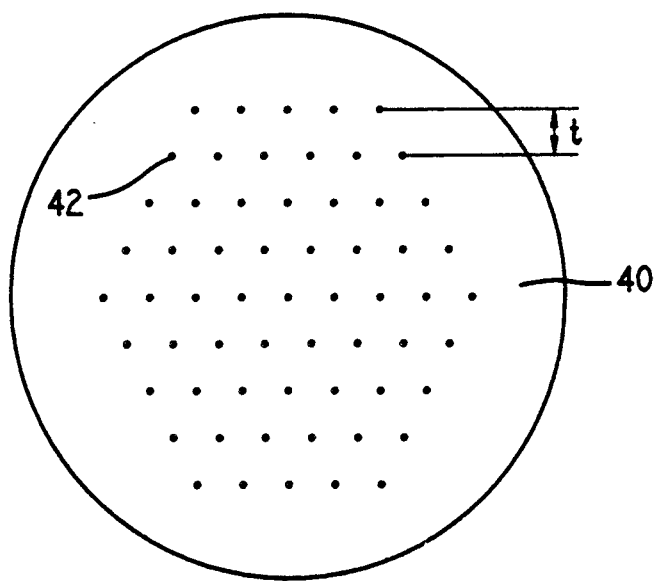
FIG. 4 is a plan view of a top piece for a reaction vessel having multiple aperatures.

FIG. 4 shows a top plate usable for reaction vessels having a plurality of holes. Specifically, the embodiment shown in FIG. 4 has 61 holes. The holes are 0.020 inches in diameter. As shown, they are spaced 0.2 inches away from their nearest neighbor. The distance "t" shown in FIG. 4 is 0.1732 inches. The use of multiple holes has been found to promote even volatilization over the surface of the film and substrate. The use of a larger number of holes, relatively evenly distributed over the surface has been found particularly useful for formation of large area and double-sided films. Especially in the case of double-sided films, a lower heating rate is used to avoid differential thermal expansion, and multiple holes permit shorter holding time at elevated temperatures. Finally, the use of multiple holes has resulted in easier control of the microstructure of the resulting superconducting film.

Figure 5A:
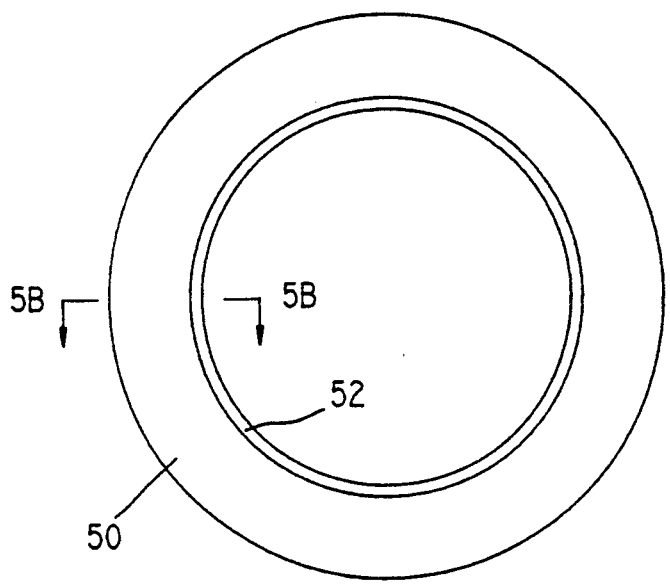
FIGS. 5a and 5b are spacer rings for a reaction vessel particularly adapted for production of double-sided films, including cross-section.
Figure 5B:
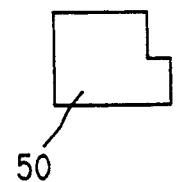
Figure 6A:
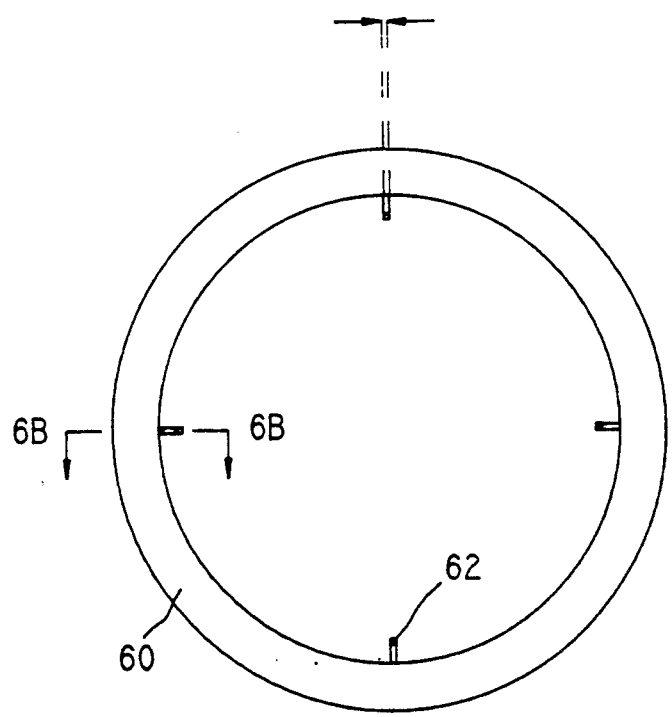
FIGS. 6a and 6b are plan views of another embodiment for a spacer ring particularly adapted for the manufacture of double-sided films, including cross-section.
Figure 6B:
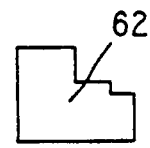

Spacer rings for reactors particularly useful for forming high temperature superconductor films on both sides of a substrate are shown in FIGS. 5 and 6.

Generally, the reaction vessel will be defined by top and bottom pieces of any desired form, preferably as shown and described in connection with FIGS. 1 through 4. The spacer rings may be formed integral with the remaining components of the vessel, but have been shown here separately for clarity and ease of explanation. In the embodiment of FIG. 5, a ledge 52 is formed in the spacer 50 which supports the wafer (not shown). In the embodiment shown, the spacer ring 50 has an outside diameter of 3 inches, and a minimum inside diameter of 1.9 inches. The ledge 52 is disposed generally half way down, with the depth of the ledge being 0.055 inches. If desired, local spacers may be placed on the ledge 52 so as to reduce the area of contact between the spacer ring 50 and the wafer. In an alternative embodiment shown in FIG. 6, the wafer, not shown, is supported by essentially point contacts 62. The spacer ring 60 includes projections 62 for supporting the wafer. A cross-section of the support 62 is shown in FIG. 6. For the embodiment shown, the outside diameter of the spacer ring 60 is 3 inches, and the inside diameter is 2.25 inches. The projections 62 are approximately 0.120 inches wide and contain a stepped profile where the side-to-side inside diameter of the upper step is 2.01 inches and the inner face inside diameter is 1.9 inches. For thin substrates it is particularly important to avoid thermal gradients which might break the wafer. If infrared heating is used to heat the wafer, and sapphire is used to form the vessel, the wafer will absorb the infrared radiation to a much higher degree than will the sapphire vessel. The vessel may be coated to have a higher absorptivity to infrared radiation, such as by coating the sapphire with metal, such a nichrome.

All publications and patent applications cited in this specification are herein incorporated by reference as if each individual publication or patent application were specifically and individually indicated to be incorporated by reference.

Although the foregoing invention has been described in some detail by way of illustration and example for purposes of clarity of understanding, it will be readily apparent to those of ordinary skill in the art in light of the teachings of this invention that certain changes and modifications may be made thereto without departing from the spirit or scope of the appended claims.

What is claimed is:

1. A reactor vessel for thermal processing of a deposited metal oxide film including thallium on a substrate to be crystallized into a superconductor, comprising a vessel including a chamber large enough to receive the substrate and film, the vessel including at least one aperture to permit controlled venting of the thallium.

2. A reaction vessel for post-deposition thermal processing of a film and substrate to be crystallized into a thallium containing superconductor, comprising:
   a top piece with one or more holes,
   a bottom piece, and
   a spacer for defining a chamber with the top piece and bottom piece, the chamber being large enough to accommodate the film and substrate.

3. The reaction vessel of claim 2 wherein the top piece, bottom piece and spacer are formed of sapphire.

4. The reaction vessel of claim 3 wherein the sapphire is coated to increase its absorption of energy.

5. The reaction vessel of claim 3 wherein the coating is nichrome.

6. The reaction vessel of the 2 wherein the top piece has two or more holes.

7. The reaction vessel of claim 6 wherein the top piece has 5 holes.

8. The reaction vessel of claim 2 wherein the bottom piece includes one or more holes.

9. The reaction vessel of claim 2 wherein the spacer includes support for the substrate.

10. The reaction vessel of claim 9 wherein the support comprises a ledge formed in the spacer.

11. The reaction vessel of claim 9 wherein the support provides for point contact between the spacer and the substrate.

12. The reactor vessel of claim 2 further including reactor clips to hold the top piece, bottom piece and spacer together.

13. The reaction vessel of claim 2 further including a cover over at least one of the holes.

14. The reaction vessel of claim 13 wherein the cover includes a channel.

15. A reaction vessel for forming superconductors on multiple sides of a substrate comprising:
   an interior chamber adapted to hold the substrate on which precursor films have previously been deposited,
   a support member adjacent the interior chamber to support the substrate and precursor films, and
   a passage between the interior chamber and the exterior of the chamber to permit controlled venting of volatile material.

16. The reaction vessel of claim 15 wherein the support member comprises an annular ledge formed in the surface of the interior chamber.

17. The reaction vessel of claim 15 wherein the support member comprises a plurality of contact supports formed adjacent the surface of the interior chamber.

18. The reactor vessel of claim 15 wherein the interior chamber is defined by a top plate, a spacer and a bottom plate.

19. The reactor vessel of claim 18 wherein the top plate and bottom plate each include one or more holes.

* * * * *